(12) United States Patent
Tak et al.

(10) Patent No.: US 8,772,872 B2
(45) Date of Patent: Jul. 8, 2014

(54) TRANSISTORS, SEMICONDUCTOR MEMORY CELLS HAVING A TRANSISTOR AND METHODS OF FORMING THE SAME

(75) Inventors: Nam-Kyun Tak, Bucheon-si (KR); Ki-Whan Song, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1059 days.

(21) Appl. No.: 12/588,276

(22) Filed: Oct. 9, 2009

(65) Prior Publication Data

US 2010/0090280 A1    Apr. 15, 2010

(30) Foreign Application Priority Data

Oct. 9, 2008  (KR) .................. 10-2008-0099064

(51) Int. Cl.
*H01L 27/12* (2006.01)
(52) U.S. Cl.
USPC .................................. 257/347; 257/E29.299
(58) Field of Classification Search
USPC .......................................... 257/347, E29.299
See application file for complete search history.

(56) References Cited

U.S. PATENT DOCUMENTS

| | | | |
|---|---|---|---|
| 5,668,021 A * | 9/1997 | Subramanian et al. | 438/282 |
| 5,936,278 A * | 8/1999 | Hu et al. | 257/336 |
| 6,096,641 A * | 8/2000 | Kunikiyo | 438/653 |
| 6,284,582 B1 * | 9/2001 | Yu | 438/202 |
| 6,861,689 B2 | 3/2005 | Burnett | |
| 2002/0008689 A1 * | 1/2002 | Koyama et al. | 345/100 |
| 2004/0201410 A1 * | 10/2004 | Koyama et al. | 327/333 |
| 2005/0082605 A1 * | 4/2005 | Akasaka | 257/329 |
| 2005/0227440 A1 * | 10/2005 | Ema et al. | 438/275 |
| 2005/0263767 A1 * | 12/2005 | Yamazaki et al. | 257/72 |
| 2005/0280065 A1 * | 12/2005 | Iwata et al. | 257/310 |
| 2007/0207581 A1 * | 9/2007 | Yasui et al. | 438/257 |
| 2007/0267678 A1 * | 11/2007 | Lo | 257/314 |
| 2009/0022003 A1 * | 1/2009 | Song et al. | 365/222 |

FOREIGN PATENT DOCUMENTS

| | | |
|---|---|---|
| JP | 2003-31696 | 1/2003 |
| JP | 2006-156540 | 6/2006 |
| KR | 10-2005-0071665 | 7/2005 |

* cited by examiner

*Primary Examiner* — Matthew Landau
*Assistant Examiner* — Igwe U Anya
(74) *Attorney, Agent, or Firm* — Harness, Dickey & Pierce, P.L.C.

(57) ABSTRACT

Transistors, semiconductor memory cells having a transistor and methods of forming the same are provided, the transistors may include a semiconductor substrate having a first semiconductor region. A gate pattern may be disposed on the first semiconductor region. Spacer patterns may each be disposed on a sidewall of the gate pattern. Second semiconductor regions and a third semiconductor regions may be disposed in the semiconductor substrate. The second semiconductor regions may be disposed under the spacer patterns. The third semiconductor regions may be disposed adjacent to the second semiconductor regions. The first semiconductor region may have a higher impurity ion concentration than the second semiconductor regions.

15 Claims, 12 Drawing Sheets

TRANSISTORS, SEMICONDUCTOR MEMORY CELLS HAVING A TRANSISTOR AND METHODS OF FORMING THE SAME

CROSS-REFERENCE TO RELATED APPLICATION

This application claims the benefit under 35 U.S.C. §119 to Korean Patent Application No. 10-2008-0099064, filed on Oct. 9, 2008 with the Korean Intellectual Property Office (KIPO), the entire contents of which are incorporated herein by reference in their entirety.

BACKGROUND

1. Field

Example embodiments relate to transistors, semiconductor memory cells having a transistor and methods of forming the same. Other example embodiments relate to transistors having a larger data storage capacity, semiconductor memory cells having the transistors and methods of forming the same.

2. Description of Related Art

In recent years, semiconductor devices are being fabricated wherein a semiconductor memory cell uses only a transistor to enable semiconductor memory operations, without forming an information storage element on a semiconductor substrate. If the information storage element is formed by implanting impurity ions in the semiconductor substrate under a gate pattern of the transistor, the information storage element may have a smaller size than the gate pattern. Also, the information storage element may be surrounded by source and drain regions that overlap with the gate pattern. As such, the information storage element may be limited to the size of the gate pattern. Because the information storage element, which may be limited in size, corresponds to a portion of the semiconductor substrate that provides a bipolar operation, it may be difficult to increase a data sensing margin of the semiconductor device.

SUMMARY

Example embodiments relate to transistors, semiconductor memory cells having a transistor and methods of forming the same. Other example embodiments relate to transistors having a larger data storage capacity, semiconductor memory cells having the transistors and methods of forming the same.

Example embodiments provide a transistor having a larger data storage capacity such that a data sensing margin of a semiconductor device is increased and a method of forming the transistor.

Example embodiments also provide a semiconductor memory cell, which prevents information storage elements corresponding to adjacent transistors from inverting data during the drive of a semiconductor device.

A transistor according to example embodiments may include a gate pattern disposed on a semiconductor substrate. A first spacer pattern may be disposed on a sidewall of the gate pattern. A first semiconductor region, a second semiconductor region and a third semiconductor region may be disposed in the semiconductor substrate. The first semiconductor region may be disposed under the gate pattern. The second semiconductor region may be disposed under the first spacer pattern. The third semiconductor region may be disposed adjacent to the first spacer pattern. The first and second semiconductor regions may have a different conductivity type than the third semiconductor region. Both lateral portions (or sidewalls) of the first semiconductor region may substantially overlap with both sidewalls of the gate pattern. The first semiconductor region may have a higher impurity ion concentration than the second semiconductor region. The first, second and third semiconductor regions are electrically connected to one another.

According to example embodiments, the semiconductor substrate may include a base plate, an insulating layer and a semiconductor layer, sequentially stacked. Each of the base plate and the semiconductor layer may include silicon. The first, second and third semiconductor regions may be disposed in the semiconductor layer in contact with the insulating layer. The second semiconductor region may have the same impurity ion concentration as the semiconductor layer.

According to example embodiments, a cross-sectional area of the gate pattern may increase from a main portion (or surface) of the semiconductor substrate toward an upper portion of the semiconductor substrate (or upper surface of the gate pattern). Each of the spacer patterns may have a substantially semicircular cross-sectional shape.

According to example embodiments, the transistor may include a second spacer pattern, a fourth semiconductor region and a fifth semiconductor region. The second spacer pattern may be disposed on the other sidewall of the gate pattern. The fourth and fifth semiconductor regions may be disposed in the semiconductor substrate. The fourth semiconductor region may be disposed under the second spacer pattern. The fifth semiconductor region may be disposed adjacent to the second spacer pattern.

The fourth semiconductor region may have the same impurity ion concentration as the second semiconductor region. The second and fourth semiconductor regions may overlap with an upper portion of the gate pattern. The fifth semiconductor region may have the same impurity ion concentration as the third semiconductor region. The fourth and fifth semiconductor regions may be disposed in the semiconductor layer in contact with the insulating layer, and electrically connected to the first, second and third semiconductor regions.

According to example embodiments, the transistor may include a gate insulating layer, a dielectric layer and electrode terminals. The gate insulating layer may be interposed between the gate pattern and the semiconductor substrate. The dielectric layer may be disposed on the gate insulating layer to cover the gate pattern and the spacer patterns. The dielectric layer may include an insulating material having a silicon nitride to apply tensile stress to the semiconductor layer. The electrode terminals may be disposed on both sides of the gate pattern. The electrode terminals may contact the insulating layer through the dielectric layer, the gate insulating layer and the semiconductor layer. The electrode terminals may be in contact with the third and fifth semiconductor regions, respectively.

A transistor according to example embodiments may include a gate pattern disposed on a semiconductor substrate. Spacer patterns may be respectively disposed on sidewalls of the gate pattern. A first semiconductor region may be disposed in the semiconductor substrate under the gate pattern. Second semiconductor regions may be disposed in the semiconductor substrate under the spacer patterns, respectively. A third semiconductor region may be disposed in at least one of the second semiconductor regions. Fourth semiconductor regions may be disposed adjacent to the spacer patterns in the semiconductor substrate. The first and second semiconductor regions may have a different conductivity type than the third and fourth semiconductor regions. Both lateral portions of the first semiconductor region substantially overlap with the sidewalls of the gate pattern. The first semiconductor region has a higher impurity ion concentration than each of the second semiconductor regions. The first, second, third and fourth semiconductor regions are electrically connected to one another.

According to example embodiments, the semiconductor substrate may include a base plate, an insulating layer and a semiconductor layer, sequentially stacked. Each of the base plate and the semiconductor layer may include silicon. The first, second, third and fourth semiconductor regions may be disposed in the semiconductor layer in contact with the insulating layer. Each of the second semiconductor regions may have the same impurity ion concentration as the semiconductor layer. The third semiconductor region may have a lower impurity ion concentration than each of the fourth semiconductor regions.

According to example embodiments, a cross-sectional area of the gate pattern may increase from a main portion (or surface) of the semiconductor substrate (or lower surface of the gate pattern) toward an upper portion of the semiconductor substrate (or upper surface of the gate pattern. Each of the spacer patterns may have a substantially semicircular cross-sectional shape.

According to example embodiments, the transistor may include a gate insulating layer, a dielectric layer and electrode terminals. The gate insulating layer may be interposed between the gate pattern and the semiconductor substrate. The dielectric layer may be disposed on the gate insulating layer to cover the gate pattern and the spacer patterns. The dielectric layer may include an insulating material having a silicon nitride to apply tensile stress to the semiconductor layer. Electrode terminals may be disposed on both sides of the gate pattern. The electrode terminals may contact the insulating layer through the dielectric layer, the gate insulating layer and the semiconductor layer. The electrode terminals may be in contact with the fourth semiconductor regions, respectively.

According to example embodiments, each of the spacer patterns may include a first and a second spacer. The second semiconductor regions may be disposed under the first spacer on a first sidewall of the gate pattern and under the first spacer on a second sidewall of the gate pattern. The second semiconductor regions may overlap with upper portions of the gate pattern. The third semiconductor region may be disposed under the second spacer on the second sidewall of the gate pattern.

According to example embodiments, each of the spacer patterns may include a first and a second spacer. The second semiconductor regions may be disposed under the first spacers disposed on the sidewalls of the gate pattern. The second semiconductor regions may overlap with the upper portions of the gate pattern. The third semiconductor region may be disposed under the second spacers disposed on the sidewalls of the gate pattern.

A semiconductor memory cell according to example embodiments may include an active region disposed in a semiconductor substrate and a device isolation region surrounding the active region. At least one gate pattern may be disposed on the active region. Spacer patterns may be respectively disposed on sidewalls of the at least one gate pattern. A first semiconductor region may be disposed in the active region under the at least one gate pattern. Second semiconductor regions may be disposed in the active region under the respective spacer patterns. Third semiconductor regions may be disposed in the active region adjacent to the spacer patterns. The first and second semiconductor regions may have a different conductivity type than the third semiconductor regions. Both lateral portions of the first semiconductor region may substantially overlap with the sidewalls of the at least one gate pattern. The first semiconductor region may have a higher impurity ion concentration than each of the second semiconductor regions. The first, second and third semiconductor regions may be electrically connected to one another.

According to example embodiments, the semiconductor substrate may include a base plate, an insulating layer and a semiconductor layer, sequentially stacked. Each of the base plate and the semiconductor layer may include silicon. The first, second and third semiconductor regions may be disposed in the semiconductor layer in contact with the insulating layer. Each of the second semiconductor regions may have the same impurity ion concentration as the semiconductor layer.

According to example embodiments, a cross-sectional area of the at least one gate pattern may increase from a main surface of the semiconductor substrate (or a lower surface of the gate pattern) toward an upper portion of the semiconductor substrate (or upper surface of the gate pattern). Each of the spacer patterns may have a substantially semicircular cross-sectional shape.

The semiconductor memory cell may include a gate insulating layer, a dielectric layer and electrode terminals. The gate insulating layer may be interposed between the at least one gate pattern and the semiconductor substrate. The dielectric layer may be disposed on the at least one gate insulating layer to cover the at least one gate pattern and the spacer patterns. The dielectric layer may include an insulating material that includes a silicon nitride to apply tensile stress to the semiconductor layer. The electrode terminals may be disposed on both sides of the gate pattern and contact the insulating layer through the dielectric layer, the gate insulating layer and the semiconductor layer. The electrode terminals may be in contact with the third semiconductor regions, respectively.

According to example embodiments, the semiconductor memory cell may include a fourth semiconductor region disposed in one of the second semiconductor regions. Each of the spacer patterns may include a first and a second spacer. The second semiconductor regions may be disposed under the first spacer disposed on a first sidewall of the at least one gate pattern and under the first spacer disposed on a second sidewall of the at least one gate pattern. The fourth semiconductor region may be disposed under the second spacer disposed on the second sidewall of the at least one gate pattern. The fourth semiconductor region may be disposed in the semiconductor layer to be in contact with the insulating layer and to be electrically connected to the first, second and third semiconductor regions.

According to example embodiments, the semiconductor memory cell may include fourth semiconductor regions disposed in the second semiconductor regions, respectively. Each of the spacer patterns may include a first and a second spacer. The second semiconductor regions may be disposed under the first spacers disposed on the sidewalls of the at least one gate pattern. The fourth semiconductor regions may be disposed under the second spacers disposed on the sidewalls of the at least one gate pattern. The fourth semiconductor regions may be disposed in the semiconductor layer to be in contact with the insulating layer and to be electrically connected to the first, second and third semiconductor regions.

A method of forming a transistor according to example embodiments may include forming mask patterns and first spacers on a semiconductor substrate. The first spacers are respectively formed on sidewalls of the mask patterns. A first semiconductor region may be formed in the semiconductor substrate between the first spacers. A gate pattern may be formed between the first spacers. The mask patterns may be removed. Second spacers may be respectively formed on sidewalls of the first spacers. Second semiconductor regions and third semiconductor regions may be formed in the semiconductor substrate. The second semiconductor regions may be formed under the first and second spacers. The third semiconductor regions are formed adjacent to the first and second spacers. The first semiconductor region may have a higher impurity ion concentration than each of the second semiconductor regions. The first and second semiconductor regions may have a different conductivity type than the third semiconductor regions. The first, second and third semiconductor regions may be electrically connected to one another.

According to example embodiments, the method may include forming a gate insulating layer on the semiconductor substrate before forming the gate pattern and the first and second spacers, and performing an ion implantation process on the semiconductor substrate using the gate pattern and the first and second spacers as a mask. The semiconductor substrate may include a base plate, an insulating layer and a semiconductor layer, which are sequentially stacked.

According to example embodiments, the formation of the second and third semiconductor regions may include simultaneously forming the third semiconductor regions in the semiconductor substrate and the second semiconductor regions between the first and third semiconductor impurity regions by implanting impurity ions in the ion implantation process. The first, second and third semiconductor regions may be disposed in the semiconductor layer in contact with the insulating layer.

According to example embodiments, the method may include forming a gate insulating layer on the semiconductor substrate prior to forming the gate pattern and the first and second spacers, forming buried holes in the gate insulating layer and the semiconductor substrate to be disposed around the second spacers, and forming conductive plugs to fill the buried holes, respectively. The semiconductor substrate may include a base plate, an insulating layer and a semiconductor layer, which are sequentially stacked.

According to example embodiments, the formation of the second and third semiconductor regions may include diffusing impurity ions from the conductive plugs into the semiconductor substrate to simultaneously form the third semiconductor regions in the semiconductor substrate and the second semiconductor regions between the first and third semiconductor regions. The first, second and third semiconductor regions may be disposed in the semiconductor layer in contact with the insulating layer.

BRIEF DESCRIPTION OF THE DRAWINGS

Example embodiments will be more clearly understood from the following detailed description taken in conjunction with the accompanying drawings.

FIG. 1 is a plan view showing a semiconductor memory device according to example embodiments;

FIGS. 2 and 3 are plan views showing a semiconductor memory cells according to example embodiments;

FIG. 4 is a cross-sectional view taken along line I-I' of the semiconductor memory cell shown in FIG. 2;

FIG. 5 is a cross-sectional view taken along line II-II' of the semiconductor memory cell shown in FIG. 3;

FIGS. 6 through 10 are cross-sectional views, taken along line I-I' of the semiconductor memory cell shown in FIG. 2, illustrating a method of forming a semiconductor memory cell according to example embodiments;

FIGS. 11 through 13 are cross-sectional views, taken along line I-I' of the semiconductor memory cell shown in FIG. 2, illustrating a method of forming a semiconductor memory cell according to example embodiments;

FIGS. 14 through 16 are cross-sectional views, taken along line I-I' of the semiconductor memory cell shown in FIG. 2, illustrating a method of forming a semiconductor memory cell according to example embodiments;

FIGS. 17 through 20 are cross-sectional views, taken along line II-II' of the semiconductor memory cell shown in FIG. 3, illustrating a method of forming a semiconductor memory cell according to example embodiments; and FIGS. 21 and 22 are cross-sectional views, taken along line II-II' of the semiconductor memory cell shown in FIG. 3, illustrating a method of forming a semiconductor memory cell according to example embodiments.

DETAILED DESCRIPTION OF EXAMPLE EMBODIMENTS

Figure 1:
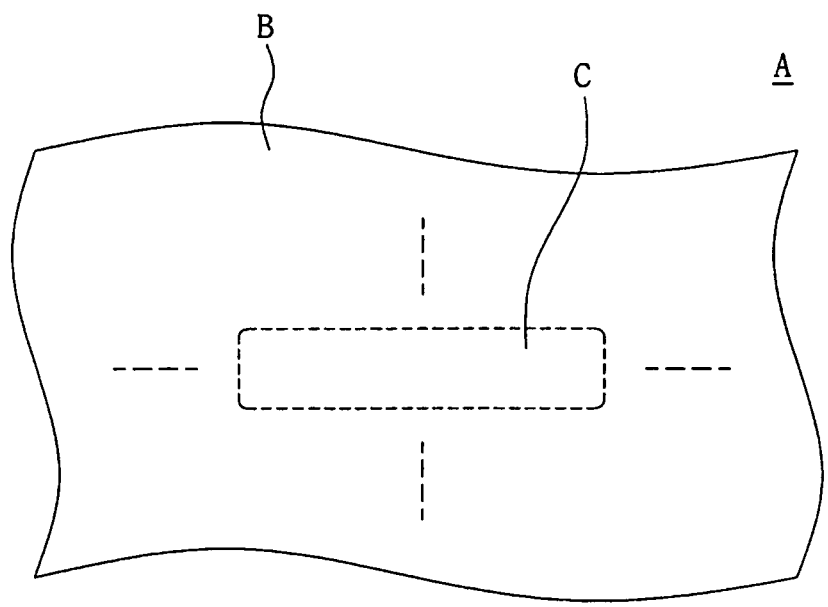
FIGS. 1-22 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to transistors, semiconductor memory cells having a transistor and methods of forming the same. Other example embodiments relate to transistors having a larger data storage capacity, semiconductor memory cells having the transistors and methods of forming the same.

Hereinafter, a transistor and a semiconductor memory cell having the transistor will be described more fully with reference to the accompanying drawings in which some example embodiments are shown.

Figure 2:
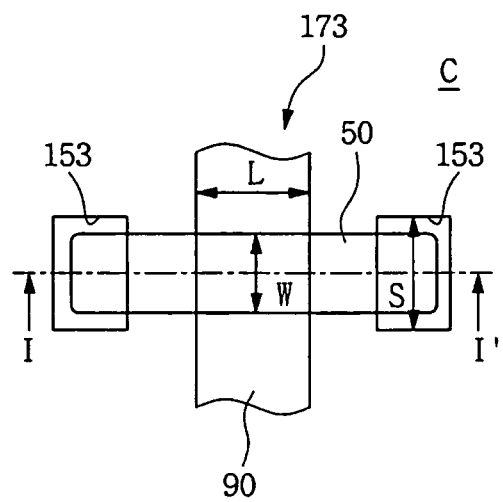
Figure 3:
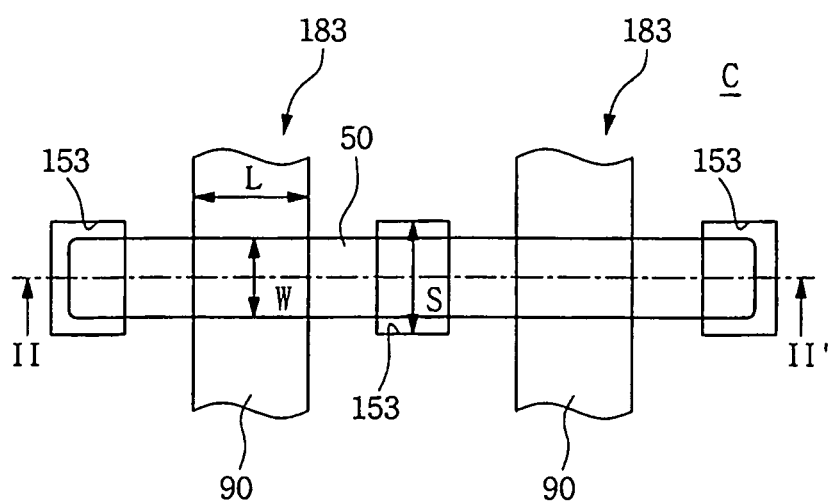
Figure 4:
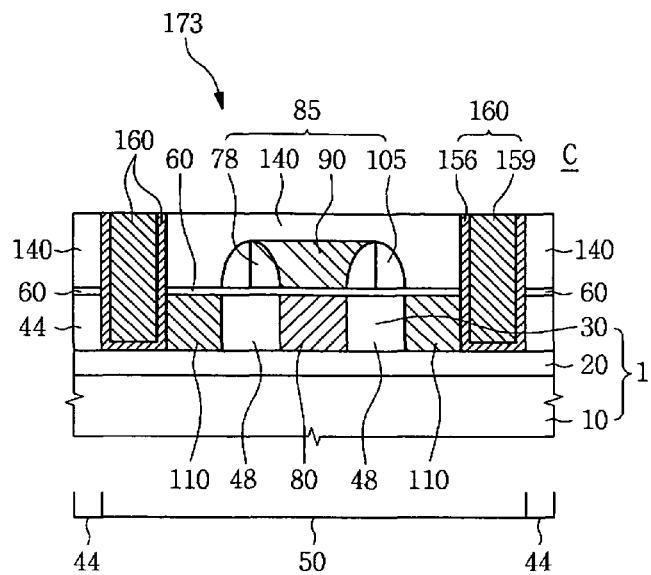
Figure 5:
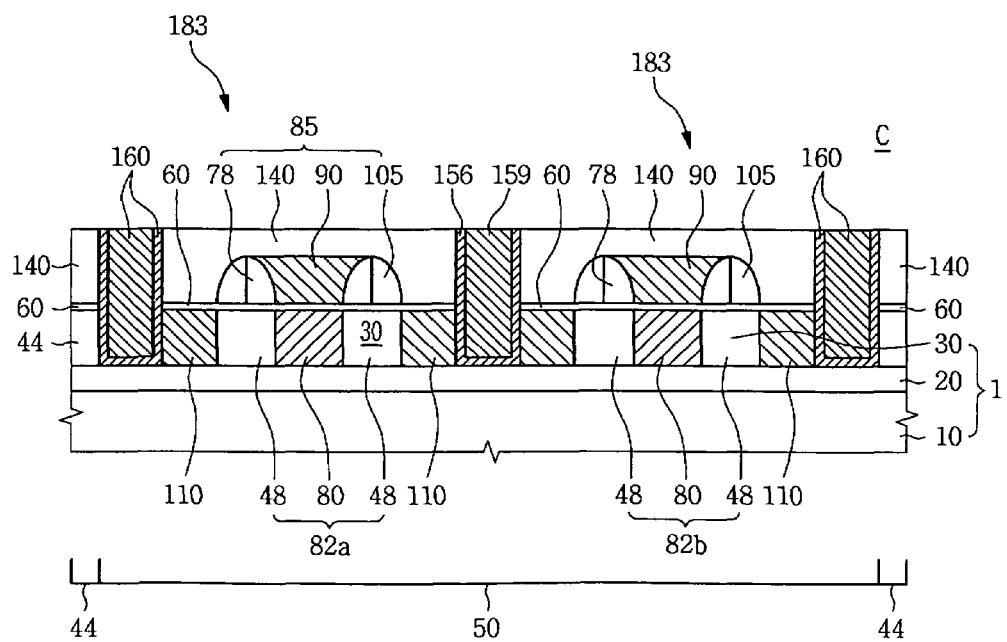

FIG. 1 is a plan view of a semiconductor memory device according to example embodiments. FIGS. 2 and 3 are plan views of a semiconductor memory cells according to example embodiments. FIG. 4 is a cross-sectional view taken along line I-I' of the semiconductor memory shown in FIG. 2. FIG. 5 is a cross-sectional view of taken along line II-II' of the semiconductor memory cell shown in FIG. 3.

A semiconductor memory cell in which a single transistor is disposed according to example embodiments will now be described.

Referring to FIG. 1, a semiconductor memory device A may be provided as shown in FIG. 1. The semiconductor memory device A may include a cell array region B and a peripheral circuit region (not shown). The cell array region B may include a plurality of semiconductor memory cells C. The cell array region B may store desired data using the semiconductor memory cells C. The peripheral circuit region may include logic circuits in order to input data into the cell array region B or output data from the cell array region B.

Referring to FIGS. 2 and 4, the semiconductor memory cell C may include a single transistor 173. The transistor 173 may include a gate pattern 90 disposed on a semiconductor substrate 1 as shown in FIG. 4. The semiconductor substrate 1 may include a base plate 10, an insulating layer 20 and a semiconductor layer 30, which are sequentially stacked, as shown in FIG. 4. The base plate 10 and the semiconductor layer 30 may include polycrystalline or single crystalline silicon. The semiconductor layer 30 may have N- or P-type conductivity. The semiconductor layer 30 may include an active region 50 and a device isolation region 44 as shown in FIG. 4. The active region 50 may be surrounded by the device isolation region 44.

According to example embodiments, the gate pattern 90 may intersect with an upper portion of the active region 50 as shown in FIG. 2. The gate pattern 90 may include a conductive material. The gate pattern 90 may have dimensions that limit a channel length L and a channel width W of the transistor 173 as shown in FIG. 2. A cross-sectional area of the gate pattern 90 may increase from a main portion of the active region 50 toward an upper portion of the active region 50 as shown in FIG. 4. Spacer patterns 85 may be disposed on both sidewalls of the gate pattern 90. The spacer patterns 85 may be formed of an insulating material.

According to example embodiments, each of the spacer patterns 85 may include a first spacer 78 and a second spacer 105 as shown in FIG. 4. The spacer patterns 85 may have a semicircular cross-sectional shape. Each of the first and second spacers 78 and 105 may have a substantially semicircular (or quarter-circular) cross-sectional shape. As shown in FIG. 4, a first semiconductor region 80 may be disposed under the gate pattern 90, and a second semiconductor region 48 may be disposed under each of the spacer patterns 85. The first and second semiconductor regions 80 and 48 may be disposed in the active region 50 and in contact with the insulating layer 20. The first and second semiconductor regions 80 and 48 may have N- or P-type conductivity. The first semiconductor region 80 may have a higher impurity ion concentration than the second semiconductor region 48. The second semiconductor regions 48 may have the same conductivity type as the semiconductor layer 30.

According to example embodiments, each of the second semiconductor regions 48 may have the same impurity ion concentration as the semiconductor layer 30. Both lateral portions (or sidewalls) of the first semiconductor region 80 may substantially overlap with both sidewalls of the gate pattern 90. The first and second semiconductor regions 80 and 48 may be information storage elements of the semiconductor memory cell C. The first and second semiconductor regions 80 and 48 may have larger areas than conventional information storage elements in order to increase a data storage capacity of the transistor 173. A sidewall of the second semiconductor regions 48 may be overlapped with upper portions (or a sidewall) of the gate pattern 90 as shown in FIG. 4. A third semiconductor region 110 may be disposed adjacent to each of the spacer patterns 85 as shown in FIG. 4.

According to example embodiments, the third semiconductor regions 110 may be disposed in the active region 50 and in contact with the insulating layer 20. The third semiconductor regions 110 may be electrically connected to the first and second semiconductor regions 80 and 48. The third semiconductor regions 110 may have a different conductivity type from the first and second semiconductor regions 80 and 48. The third semiconductor regions 110 may respectively be source and drain regions of the transistor 173. Alternatively, the third semiconductor regions 110 may respectively be drain and source regions of the transistor 173. The third semiconductor regions 110 may not overlapped with the gate pattern 90.

The third semiconductor regions 110 may structurally preclude (or prevent) generation of a gate induced drain leakage (GIDL) current in the active region 50 during the drive of the transistor 173. The first and second semiconductor regions 80 and 48 may prevent (or reduce the likelihood of) the third semiconductor regions 110 from diffusing toward a region disposed under the gate pattern 90. As such, even with a reduction in the design rule of the semiconductor memory cell C, the first and second semiconductor regions 80 and 48 may increase an effective channel length of the transistor 173 more than in the conventional art.

According to example embodiments, a gate insulating layer 60 may be disposed between the gate pattern 90 and the active region 50 as shown in FIG. 4. A dielectric layer 140 may be disposed on the gate insulating layer 60 to cover the gate pattern 90 and the spacer patterns 85. The dielectric layer 140 may include an insulating material containing silicon nitride so as to apply tensile stress to the semiconductor layer 30. The dielectric layer 140 may apply tensile stress to the semiconductor layer 30, thus increasing the mobility of charges passing through the transistor 173.

According to example embodiments, electrode terminals 160 may be disposed on both sides of the gate pattern 90. The electrode terminals 160 may contact the insulating layer 20. The electrode terminals 160 may be formed through the dielectric layer 140, the gate insulating layer 60 and the semiconductor layer 30. Each of the electrode terminals 160 may include a metal nitride layer 156 and a metal layer 159, which are sequentially stacked (or formed). The electrode terminals 160 may be in contact with the third semiconductor regions 110, respectively, as shown in FIG. 4. The electrode terminals 160 may be in ohmic contact with the third semiconductor regions 110, respectively. Each of the electrode terminals 160 may have a width S, which is greater than the channel width W of the transistor 173 as shown in FIG. 2.

According to example embodiments, if charges are stored in the information storage elements (i.e., the first and second semiconductor regions 80 and 48), the transistor 173 may be a metal oxide silicon/semiconductor field effect transistor (MOSFET). The transistor 173 may put (or set) the gate pattern 90 into an electrical on-state. The transistor 173 may apply voltages, with a polarity in the reverse direction as that of voltages applied to the first and second semiconductor regions 80 and 48, to the third semiconductor regions 110. As such, the transistor 173 may generate electrons and holes in the vicinity of one of the third semiconductor regions 110 (e.g., drain region).

The transistor 173 may store the generated electrons, or holes, in the first and second semiconductor regions 80 and 48. The reverse voltages applied to the third semiconductor regions 110 may inhibit emission of the electrons, or holes, from the first and second semiconductor regions 80 and 48. The second semiconductor regions 48 may be interposed between the first and third semiconductor regions 80 and 110 to cause graded junctions, which may reduce the electric field intensity of junctions between the first and third semiconductor regions 80 and 110. The second semiconductor regions 48 may inhibit emission of electrons, or holes, from the first and second semiconductor regions 80 and 48.

According to example embodiments, if electrons (or holes) are emitted from the information storage elements (i.e., the first and second semiconductor regions 80 and 48), the transistor 173 may perform a bipolar operation using the first, second and third semiconductor regions 80, 48 and 110. The transistor 173 may put (or set) the gate pattern 90 into an electrical off-state. The transistor 173 may apply a voltage, with a polarity in the reverse direction as that of voltages applied to the first and second semiconductor regions 80 and 48, to one of the third semiconductor regions 110 (e.g., source region). The transistor 173 may apply a voltage, with a polarity in the same direction as that of the voltages applied to the first and second semiconductor regions 80 and 48, to the remaining one of the third semiconductor regions 110 (e.g., drain region).

As such, the transistor 173 may emit electrons (or holes) from the first and second semiconductor regions 80 and 48 through the remaining one of the third semiconductor regions 110 (i.e., drain region). Linear junctions may be substantially formed between the second and third semiconductor regions 48 and 110 as shown in FIG. 4. The linear junctions may facilitate the emission of more electrons (or holes) from the first and second semiconductor regions 80 and 48 per unit time compared with in the conventional art. The electrode terminals 160 disposed in the source and drain regions may be in ohmic contact with the third semiconductor regions 110, contributing effectually to rapid emission of electrons (or holes) from the first and second semiconductor regions 80 and 48.

A semiconductor memory cell in which two transistors are disposed according to example embodiments will now be described below. In the following example embodiments, the same reference numerals and sizes can be used to denote the same materials and components as in the above-described example embodiments.

FIG. 5 is a cross-sectional view taken along line II-II' of the semiconductor memory cell shown in FIG. 3.

Referring to FIGS. 1, 3 and 5, a semiconductor memory device A may be provided as shown in FIG. 1. The semiconductor memory device A may include a cell array region B and a peripheral circuit region (not shown) as is previously described. The cell array region B may include a plurality of semiconductor memory cells C. Each of the semiconductor memory cells C may include at least two transistors 183 as shown in FIGS. 3 and 5. The transistors 183 may each include a gate pattern 90 disposed on a semiconductor substrate 1.

The semiconductor substrate 1 may include a base plate 10, an insulating layer 20 and a semiconductor layer 30, which are sequentially stacked as shown in FIG. 5. The semiconductor substrate 1 may include an active region 50 and a device isolation region 44. The active region 50 and the device isolation region 44 may be disposed in the semiconductor substrate 1. The gate patterns 90 may be disposed a set distance apart from each other on the active region 50 as shown in FIGS. 3 and 5. Each of the gate patterns 90 may have a channel length L and a channel width W as shown in FIG. 3. A spacer pattern 85, including a first spacer 78 and a second spacer 105, may be disposed on each sidewall of the gate patterns 90 as shown in FIG. 5.

Referring to FIG. 5, a first semiconductor region 80 and second semiconductor regions 48 may be disposed under the gate patterns 90 and the spacer patterns 78 and 105, respectively, in the active region 50. A third semiconductor region 110 may be disposed adjacent to each of the spacer patterns 78 and 105 disposed in the active region 50. An electrode terminal 160 may be disposed around (or on each side of) the gate patterns 90 as shown in FIG. 5. A gate insulating layer 60 may be disposed between the gate patterns 90 and the semiconductor substrate 1.

A dielectric layer 140 may be disposed on the gate insulating layer 60, the gate patterns 90 and the spacer patterns 85. The gate insulating layer 60, the semiconductor layer 30 and the dielectric layer 140 may surround electrode terminals 160. According to example embodiments, the semiconductor memory cell C may include two information storage elements 82a/b disposed in the active region 50. Each of the information storage elements 82a/b may include the first and second semiconductor regions 80 and 48 disposed under each of the gate patterns 90. The semiconductor memory cell C according to example embodiments may increase the integration density of the semiconductor memory device A. A sidewall of the second semiconductor region 48 may overlap with upper portions (or sidewalls) of the gate patterns 90.

Each of the transistors 183 shown in FIGS. 3 and 5 may have the same electrical effects as the transistor 173 shown in FIGS. 2 and 4. According to example embodiments, the electrode terminal 160 interposed between the gate patterns 90 may inhibit electrons, or holes, from moving between adjacent data storage elements during the drive of the transistors 183 because a width S of the electrode terminal 160 interposed between the gate patterns 90 according to example embodiments is physically greater in size than the channel width W of one of the gate patterns 90 as shown in FIG. 3. The electrode terminal 160 interposed between the gate patterns 90 according to example embodiments may be a compulsory unit that causes its adjacent information storage elements 82a and 82b retain data therein.

Hereinafter, a method of forming a transistor according to example embodiments will be described with reference to the remaining drawings. In this case, the same reference numerals and sizes can be used to denote the same materials and components.

FIGS. 6 through 10 are cross-sectional views, taken along line I-I' of the semiconductor memory cell shown in FIG. 2, illustrating a method of forming a semiconductor memory cell according to example embodiments.

Figure 6:
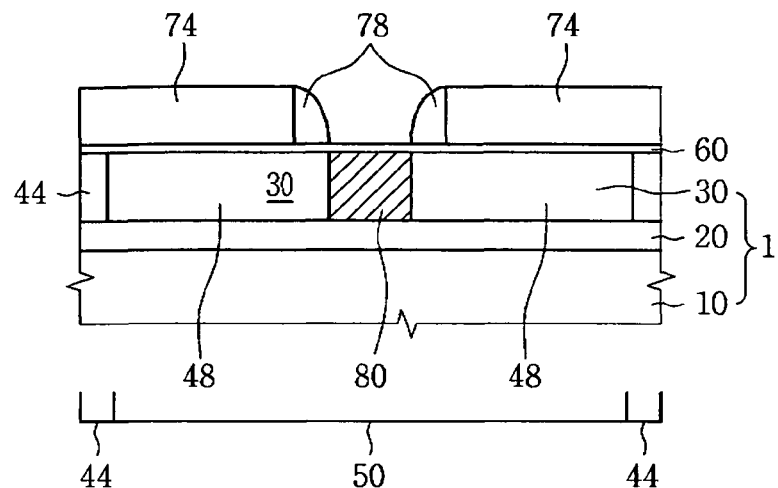

Referring to FIG. 6, a semiconductor substrate 1 may be prepared according to example embodiments. The semiconductor substrate 1 may include a base plate 10, an insulating layer 20 and a semiconductor layer 30, which are sequentially stacked. Each of the base plate 20 and the semiconductor layer 30 may include a single crystalline silicon or polycrystalline silicon. The semiconductor layer 30 may have N-type or P-type conductivity. A device isolation region 44 and an active region 50 may be formed in the semiconductor layer 30. The device isolation region 44 may be formed to surround the active region 50. The device isolation region 44 may include a silicon oxide layer, a silicon nitride layer or a stacked layer thereof.

According to example embodiments, a gate insulating layer 60 may be formed on the device isolation region 44 and the active region 50. The gate insulating layer 60 may include silicon oxide, silicon nitride or stacked material thereof. Mask patterns 74 may be formed on the gate insulating layer 60. The mask patterns 74 may include silicon oxide, silicon nitride or stacked material thereof. A first spacer 78 may be formed on each sidewall of the mask patterns 74 over the action region 50. The first spacers 78 may include silicon oxide, silicon nitride or stacked material thereof. A first semiconductor region 80 may be formed in the active region 50 using the mask patterns 74 and the first spacers 78 as a mask.

According to example embodiments, the first semiconductor region 80 may be formed using an ion implantation process. The first semiconductor region 80 may have N-type or P-type conductivity. As such, the active region 50 may have the first and second semiconductor regions 48. The first and second semiconductor regions 80 and 48 may have the same conductivity type as the semiconductor layer 30. The first semiconductor region 80 may have a higher impurity ion concentration than each of the second semiconductor regions 48. Each of the second semiconductor regions 48 may have the same impurity ion concentration as the semiconductor layer 30.

Figure 7:
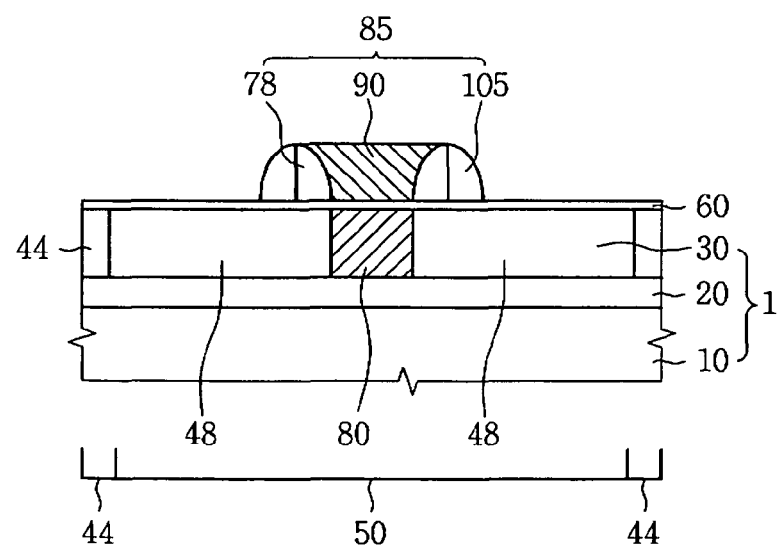

Referring to FIG. 7, a gate pattern 90 may be formed to fill a space between the first spacers 78. The gate pattern 90 may include a conductive material. The mask patterns 74 may be removed using the gate insulating layer 60, the first spacers 78 and the gate pattern 90 as an etch buffer layer. The mask patterns 74 may be removed using a dry or wet etching technique. A second spacer 105 may be formed on a sidewall of the first spacers 78. The second spacers 105 may include the same material as, or a different material than, the first spacers 78. The first and second spacers 78 and 105 may constitute spacer patterns 85.

Figure 8:
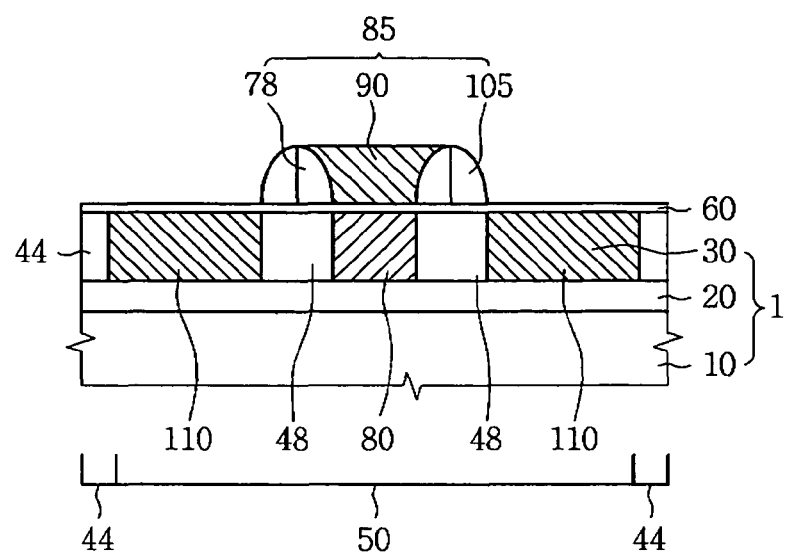

Referring to FIG. 8, an ion implantation process may be performed on the active region 50 using the spacer patterns and the gate pattern 90 as a mask. During the ion implantation process, third semiconductor regions 110 may be formed by implanting (or using) impurity ions in a portion of the active region 50 adjacent to the spacer patterns. The second semiconductor regions 48 may be redefined between the first and third semiconductor regions 80 and 110. The third semiconductor regions 110 may have a different conductivity type from the first and second semiconductor regions 80 and 48. The second semiconductor regions 48 may be confined under the spacer patterns 85.

Figure 9:
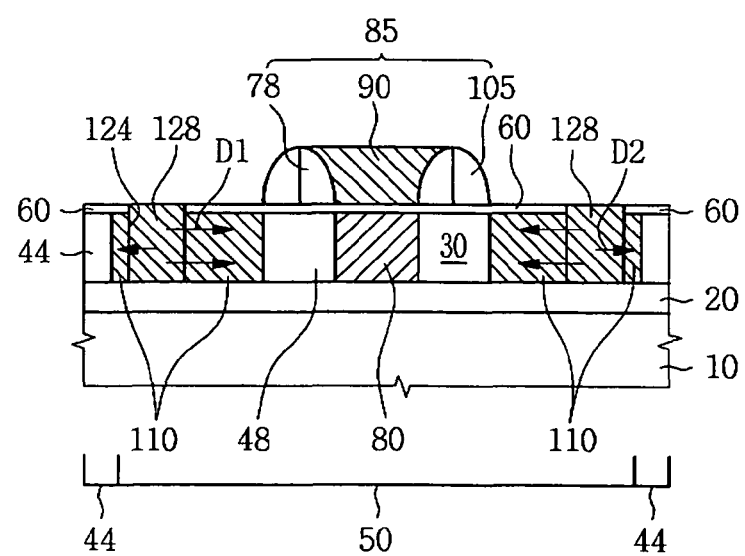

Referring to FIG. 9, a photoresist layer (not shown) may be formed on the gate insulating layer 60, the gate pattern 90 and the spacer patterns 85 shown in FIG. 7. The photoresist layer may have openings to expose the gate insulating layer 60 adjacent to the spacer patterns. The openings in the photoresist layer may be formed on both sides of the gate pattern 90. The gate insulating layer 60 and the semiconductor layer 30 may be etched through the openings of the photoresist layer, forming buried holes 124 exposing the insulating layer 20.

After the formation of the buried holes 124, the photoresist layer may be removed. Conductive plugs 128 may be formed to fill the buried holes 124. Impurity ions may diffuse from the conductive plugs 128 into the second semiconductor regions 48 in the directions indicated by arrows D1 and D2, forming third semiconductor regions 110. The third semiconductor regions 110 may have a different conductivity from the first and second semiconductor regions 80 and 48. The conductive plugs 128 may redefine the second semiconductor regions 48 between the first and third semiconductor regions 80 and 110. As such, the second semiconductor regions 48 may be confined under the spacer patterns.

Figure 10:
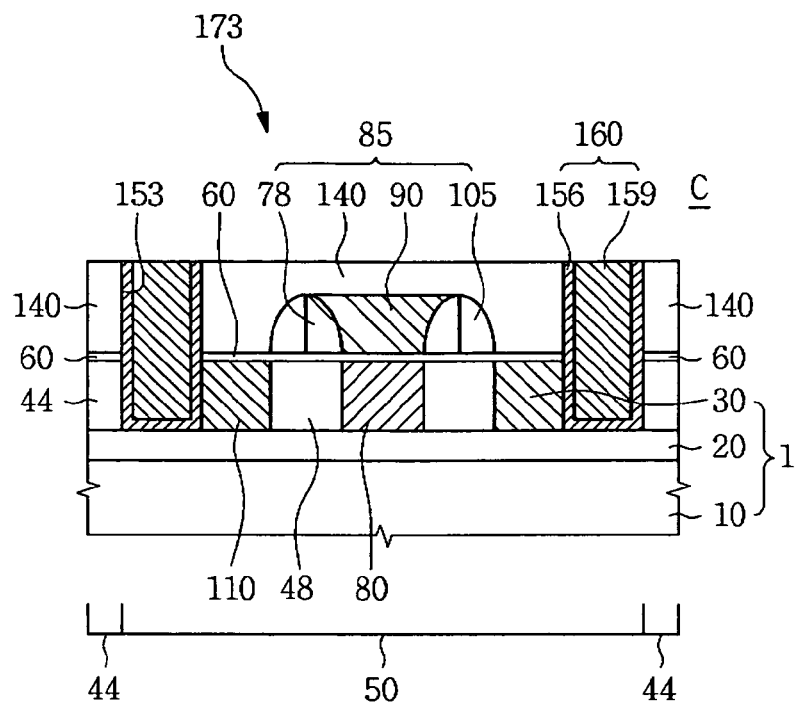

Referring to FIG. 10, a dielectric layer 140 may be formed on the gate insulating layer 60, the gate pattern 90 and the spacer patterns. The dielectric layer 140 may include an insulating material including silicon nitride so as to apply tensile stress to the semiconductor layer 30. A photoresist layer (not shown) may be formed on the dielectric layer 140. The photoresist layer may have openings with diameters that are greater in size than the widths of the buried holes 124 of FIG. 9.

The dielectric layer 140, the gate insulating layer 60 and the semiconductor layer 30 may be etched through the openings of the photoresist layer, forming contact holes 153 exposing the insulating layer 20. The contact holes 153 may expose the device isolation region 44 and the third semiconductor regions 110 of FIG. 8 or 9 disposed adjacent thereto. Alternatively, the contact holes 153 may expose only the third semiconductor regions 110 of FIG. 8 or 9 disposed adjacent thereto. The contact holes 153 may be filled with electrode terminals 160, forming a transistor 173 according to example embodiments. Each of the electrode terminals 160 may include a metal nitride layer 156 and a metal layer 159, which are sequentially stacked. The transistor 173 may include the components shown in FIG. 2, together with the third semiconductor regions 110, to form a semiconductor memory cell C.

Figure 11:
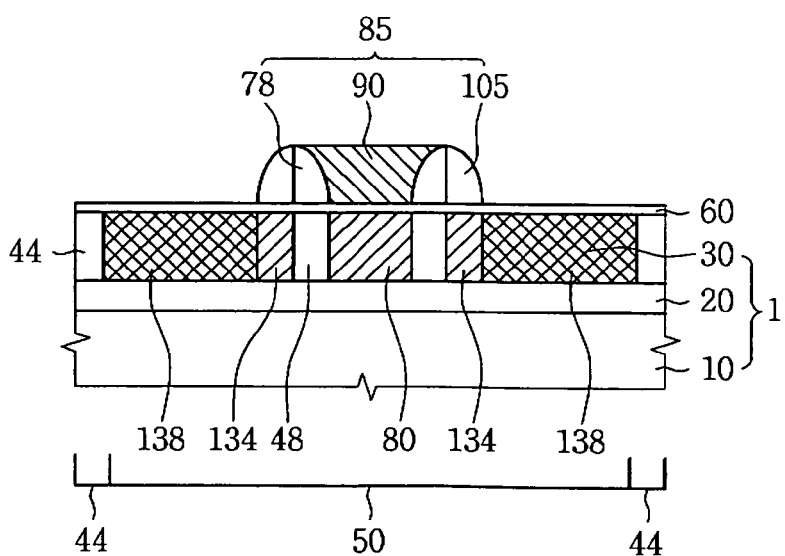
Figure 12:
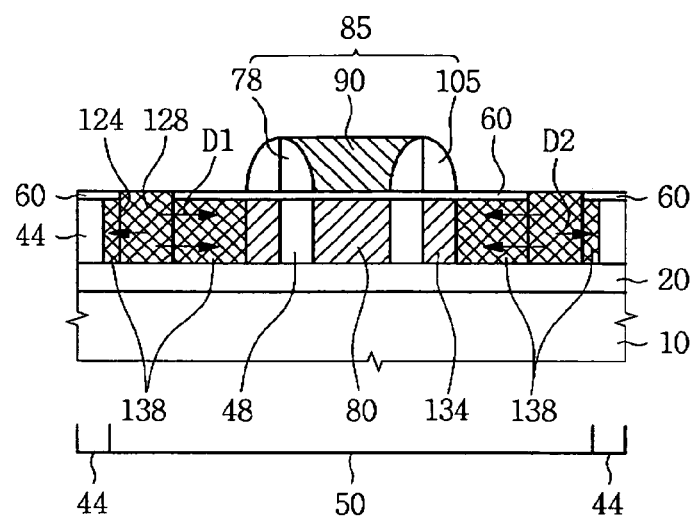
Figure 13:
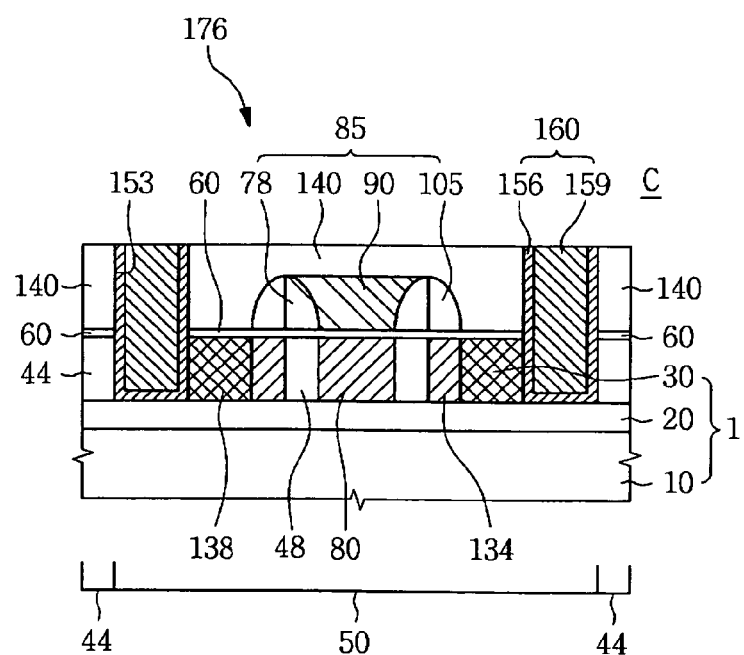

FIGS. 11 through 13 are cross-sectional views, taken along line I-I' of the semiconductor memory cell shown in FIG. 2, illustrating a method of forming a semiconductor memory cell according to example embodiments.

The method shown in FIG. 11 may be performed on the resultant structure shown in FIG. 7 in which first spacers 78 are formed.

Referring to FIG. 11, an ion implantation process may be performed on an active region 50 using a gate pattern 90 and the first spacers 78 as a mask. During the ion implantation process, third semiconductor regions 134 may be formed by implanting (or using) impurity ions in second semiconductor regions 48. The third semiconductor regions 134 may have a different conductivity type from the first and second semiconductor regions 80 and 48. As such, the second semiconductor regions 48 may be redefined between the first and third semiconductor regions 80 and 134.

According to example embodiments, after the formation of the third semiconductor regions 134, a second spacer 105 may be formed on a sidewall of the first spacers 78. The first and second spacers 78 and 105 may constitute spacer patterns 85. An ion implantation process may be performed on the active region 50 using the gate pattern 90 and the spacer patterns 85 as a mask. In the ion implantation process, fourth semiconductor regions 138 may be formed by implanting (or using) impurity ions in the third semiconductor regions 134. The fourth semiconductor regions 138 may have the same conductivity type as the third semiconductor regions 134. As such, the third semiconductor regions 134 may be redefined between the second and fourth semiconductor regions 48 and 138.

According to example embodiments, the second semiconductor regions 48 may overlap with upper portions (or a sidewall) of the gate pattern 90. The third and fourth semiconductor regions 134 and 138 may have a different conductivity type from the first and second semiconductor regions 80 and 48. The fourth semiconductor regions 138 may have a higher impurity ion concentration than the third semiconductor regions 134. The fourth semiconductor regions 138 according to example embodiments may correspond to the third semiconductor regions 110 shown in FIGS. 8 and 9.

Referring to FIG. 12, a photoresist layer (not shown) may be formed on the gate insulating layer 60, the gate pattern 90 and the spacer patterns 85. The photoresist layer may have openings to expose the gate insulating layer 60 disposed adjacent to the spacer patterns 85 shown in FIG. 11. The openings of the photoresist layer may be formed on both sides of the gate pattern 90. The gate insulating layer 60 and the semiconductor layer 30 may be etched through the openings of the photoresist layer, forming buried holes 124 exposing an insulating layer 20.

After the formation of the buried holes 124, the photoresist layer may be removed. Conductive plugs 128 may be formed to fill the buried holes 124. Impurity ions may be diffused from the conductive plugs 128 into the third semiconductor regions 134 of FIG. 11 in the directions indicated by arrows D1 and D2, forming fourth semiconductor regions 138. The fourth semiconductor regions 138 correspond to the fourth semiconductor regions 138 of FIG. 11. The third and fourth semiconductor regions 134 and 138 may have a different conductivity from the first and second semiconductor regions 80 and 48. The conductive plugs 128 may redefine the third semiconductor regions 134 between the second and fourth semiconductor regions 48 and 138. The third semiconductor regions 134 may be confined under the second spacers 105.

Referring to FIG. 13, a dielectric layer 140 may be formed on the gate insulating layer 60, the gate pattern 90 and the spacer patterns 85. A photoresist layer (not shown) may be formed on the dielectric layer 140. The photoresist layer may have openings having diameters greater in size than the widths of the buried holes 124 of FIG. 12. The dielectric layer 140, the gate insulating layer 60 and the semiconductor layer 30 may be etched through the openings of the photoresist layer, forming contact holes 153 exposing the insulating layer 20.

The contact holes 153 may expose a device isolation region 44 and the fourth semiconductor regions 138 of FIG. 11 or 12 disposed adjacent thereto. Alternatively, the contact holes 153 may expose only the fourth semiconductor regions 138 of FIG. 11 or 12 disposed adjacent thereto. The contact holes 153 may be filled with electrode terminals 160, forming a transistor 176. Each of the electrode terminals 160 may include a metal nitride layer 156 and a metal layer 159, which are sequentially stacked. The transistor 176 may include the components shown in FIG. 2, together with the third and fourth semiconductor regions 134 and 138, to form a semiconductor memory cell C.

According to example embodiments, graded junctions with a lower electric field intensity may be obtained in the vicinity of source and drain regions of the transistor 176 because the transistor 176 has junctions between the second semiconductor regions 48 and the third semiconductor regions 134 in the vicinity of the source and drain regions. As such, the retention time of charges stored in information storage elements may increase.

Figure 14:
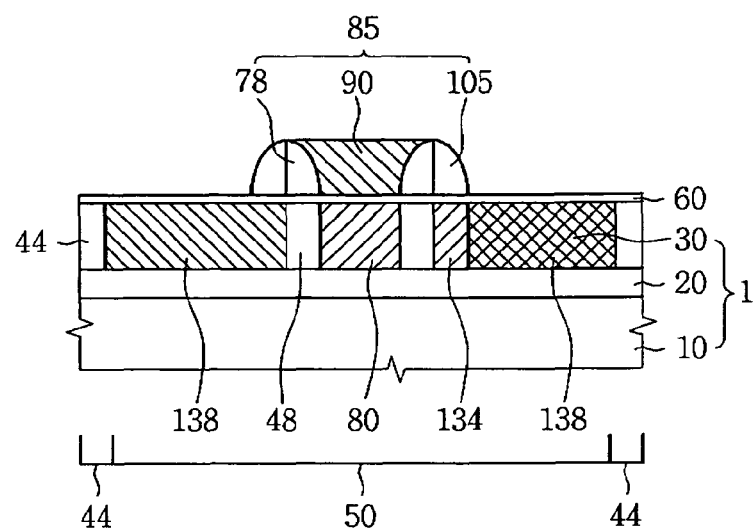
Figure 15:
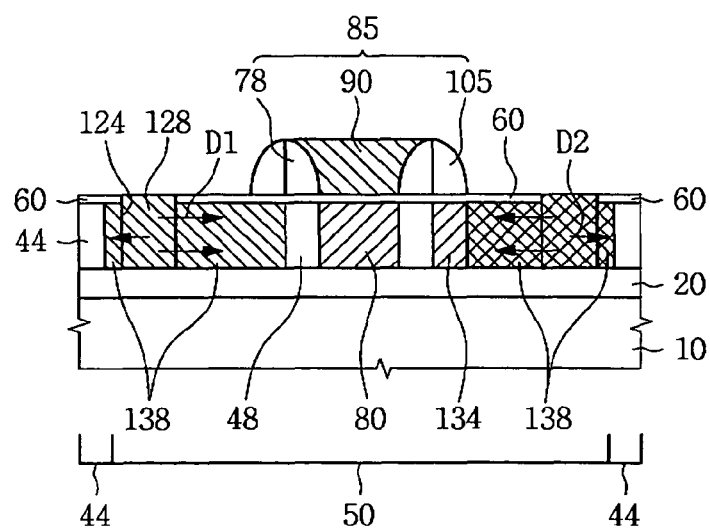
Figure 16:
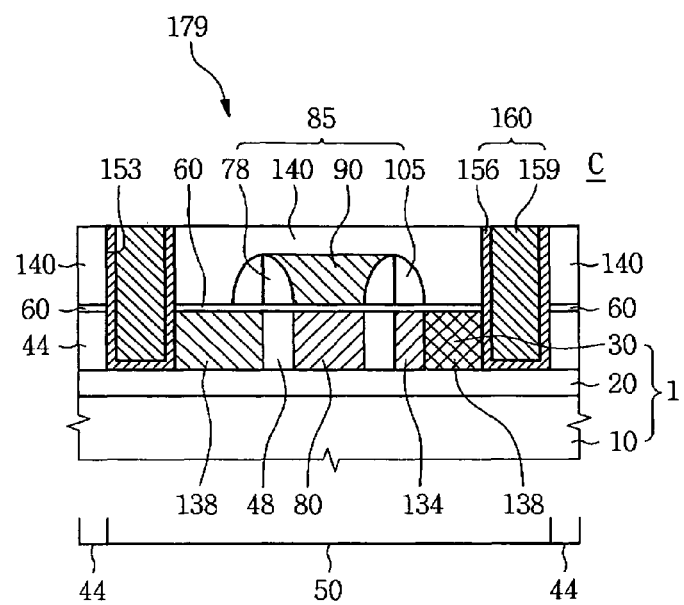

FIGS. 14 through 16 are cross-sectional views, taken along line I-I' of the semiconductor memory cell shown in FIG. 2, illustrating a method of forming a semiconductor memory cell according to example embodiments.

The method shown in FIG. 14 may be performed on the resultant structure shown in FIG. 7 in which first spacers 78 are formed.

Referring to FIG. 14, a photoresist pattern (not shown) may be formed on a gate insulating layer 60 to cover a portion of a gate pattern 90 and one of the first spacers 78 disposed adjacent to the gate pattern 90. The photoresist pattern may be formed to expose the remaining portion of the gate pattern 90 and the remaining one of the first spacers 78. An ion implantation process may be performed on a semiconductor layer 30 using the remaining portion of the gate pattern 90 and the remaining one of the first spacers 78 as a mask.

According to example embodiments, in the ion implantation process, a third semiconductor region 134 may be formed by implanting (or using) impurity ions in one of second semiconductor regions 48. After the formation of the third semiconductor region 134, the photoresist pattern may be removed from a semiconductor substrate 1. Second spacers 105 may be formed on sidewalls of the first spacers 78. The first and second spacers 78 and 105 may constitute spacer patterns 85. An ion implantation process may be performed using the gate pattern 90 and the spacer patterns 85 as a mask. In the ion implantation process, fourth semiconductor regions 138 may be formed by implanting (or using) impurity ions in the remaining second semiconductor regions 48 and the third semiconductor region 134.

According to example embodiments, one of the fourth semiconductor regions 138 may overlap with the second spacer 105. The remaining one of the fourth semiconductor regions 138 may be disposed adjacent to the second spacer 105. The third semiconductor region 134 may be disposed in a drain region of a transistor 179 of FIG. 16. In a source region of the transistor 179, a first semiconductor region 80 and the one of the fourth semiconductor regions 138 may redefine the second semiconductor region 48 under the first spacer 78. In the drain region of the transistor 179, the second semiconductor region 48 may be redefined between the first and third semiconductor regions 80 and 134 under the first spacer 78.

According to example embodiments, the third semiconductor region 134 may be redefined between the second and remaining one of the fourth semiconductor regions 48 and 138 under the second spacer 105. The third and remaining one of the fourth semiconductor regions 134 and 138 shown in FIG. 14 may have the same conductivity type and the same impurity ion concentration as the third and fourth semiconductor regions 134 and 138 shown in FIG. 11.

Referring to FIG. 15, a photoresist layer (not shown) may be formed on the gate insulating layer 60, the gate pattern 90 and the spacer patterns 85 shown in FIG. 14. The photoresist layer may have openings to expose the gate insulating layer 60 disposed adjacent to the spacer patterns 85. The openings of the photoresist layer may be formed on both sides of the gate pattern 90. The gate insulating layer 60 and the semiconductor layer 30 may be etched through the openings of the photoresist layer, forming buried holes 124 exposing the insulating layer 20.

After the formation of the buried holes 124, the photoresist layer may be removed. Conductive plugs 128 may be formed to fill the buried holes 124. Impurity ions may be diffused from the conductive plugs 128 into a second semiconductor region 48 and a third semiconductor region 134 in the directions indicated by arrows D1 and D2, forming fourth semiconductor regions 138. One of the fourth semiconductor regions 138 may be formed in the second semiconductor region 48 in the source region of the transistor 179 of FIG. 16. The conductive plug 128 disposed in the source region may redefine the second semiconductor region 48 between the first and one of the fourth semiconductor regions 80 and 138. As such, the second semiconductor region 48 disposed in the source region may be formed under the first spacer 78.

The other fourth semiconductor regions 138 may be formed in the third semiconductor region 134 in the drain region of the transistor 179. The third semiconductor regions 134 correspond to the third semiconductor regions 134 of FIG. 14. The conductive plug 128 disposed in the drain region may redefine the third semiconductor region 134 between the second and other fourth semiconductor regions 48 and 138. As such, the third semiconductor region 134 disposed in the drain region may be formed under the second spacer 105. The third and other fourth semiconductor regions 134 and 138 shown in FIG. 15 may correspond to the third and fourth semiconductor regions 134 and 138 shown in FIG. 12.

Referring to FIG. 16, a dielectric layer 140 may be formed on the gate insulating layer 60, the gate pattern 90 and the spacer patterns 85. A photoresist layer (not shown) may be formed on the dielectric layer 140. The photoresist layer may have openings with diameters that are greater in size than the widths of the buried holes 124 of FIG. 15. The dielectric layer 140, the gate insulating layer 60 and the semiconductor layer 30 may be etched through the openings of the photoresist layer, forming contact holes 153 exposing the insulating layer 20.

The contact holes 153 may expose a device isolation region 44 and the fourth semiconductor regions 138 of FIG. 14 or 15 disposed adjacent thereto. Alternatively, the contact holes 153 may expose only the fourth semiconductor regions 138 of FIG. 14 or 15 disposed adjacent thereto. The contact holes 153 may be filled with electrode terminals 160, forming the transistor 179. Each of the electrode terminals 160 may include a metal nitride layer 156 and a metal layer 159, which are sequentially stacked. The transistor 179 may include the components shown in FIG. 2 to form a semiconductor memory cell C.

According to example embodiments, a graded junction with lower electric field intensity may be obtained in the vicinity of the drain region of the transistor 179 because the transistor 179 has a junction between the second semiconductor region 48 and the third semiconductor region 134 in the vicinity of the drain region. As such, the retention time of charges stored in information storage elements may increase.

FIGS. 17 through 20 are cross-sectional views, taken along line II-II' of the semiconductor memory cell shown in FIG. 3, illustrating a method of forming a semiconductor memory cell according to example embodiments.

Figure 17:
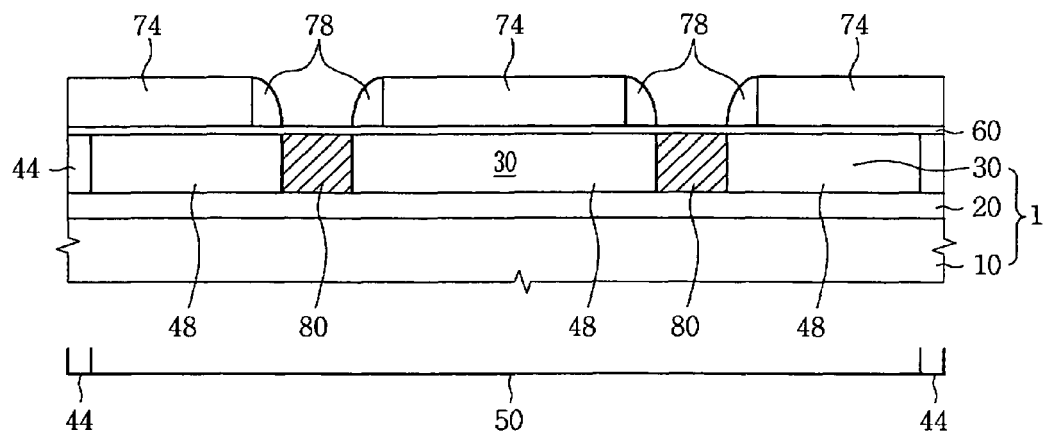

Referring to FIG. 17, a semiconductor substrate 1 may be prepared according example embodiments. The semiconductor substrate 1 may correspond to the semiconductor substrate of FIG. 6. The semiconductor substrate 1 may include a base plate 10, an insulating layer 20 and a semiconductor layer 30, which are sequentially stacked. A device isolation region 44 and an active region 50 may be formed in the semiconductor layer 30. The device isolation region 44 may surround the active region 50. A gate insulating layer 60 may be formed on the semiconductor layer 30 and the device isolation region 44. Mask patterns 74 may be formed on the gate insulating layer 60. First spacers 78 may be formed on sidewalls of the mask patterns 74.

According to example embodiments, an ion implantation process may be performed on the active region 50 using the mask patterns 74 and the first spacers 78 as a mask. In the ion implantation process, first semiconductor regions 80 may be formed by implanting (or using) impurity ions in the active region 50. The first semiconductor regions 80 may have N-type or P-type conductivity. As such, the active region 50 may include the first and second semiconductor regions 80 and 48. The first and second semiconductor regions 80 and 48 may have the same conductivity type as the semiconductor layer 30. Each of the first semiconductor regions 80 may have a higher impurity ion concentration than that of the second semiconductor regions 48.

According to example embodiments, each of the second semiconductor regions 48 may have the same impurity ion concentration as the semiconductor layer 30.

Figure 18:
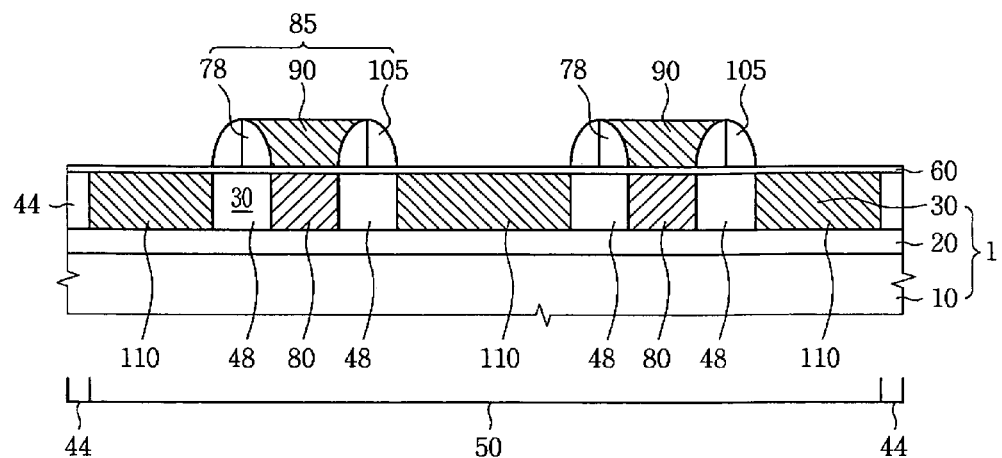

Referring to FIG. 18, the gate patterns 90 may be formed to fill spaces between the first spacers 78. Both sidewalls of the gate patterns 90 may overlap with both lateral portions of (or sidewalls) of the respective first semiconductor regions 80. The second semiconductor regions 48 may overlap with upper portions (or a sidewall) of gate patterns 90. The mask patterns 74 may be removed using the gate insulating layer 60, the first spacers 78 and the gate patterns 90 as an etch buffer layer. Second spacers 105 may be formed on sidewalls of the first spacers 78. The first and second spacers 78 and 105 may constitute spacer patterns 85.

According to example embodiments, an ion implantation process may be performed on the active region 50 using the spacer patterns 85 and the gate patterns 90 as a mask. In the ion implantation process, third semiconductor regions 110 may be formed in the active region 50 adjacent to the spacer patterns 85. The third semiconductor regions 110 may have a different conductivity type from the first and second semiconductor regions 80 and 48. The second semiconductor regions 48 may be redefined between the first and third semiconductor regions 80 and 110. As such, the second semiconductor regions 48 may be confined under the spacer patterns 85.

Figure 19:
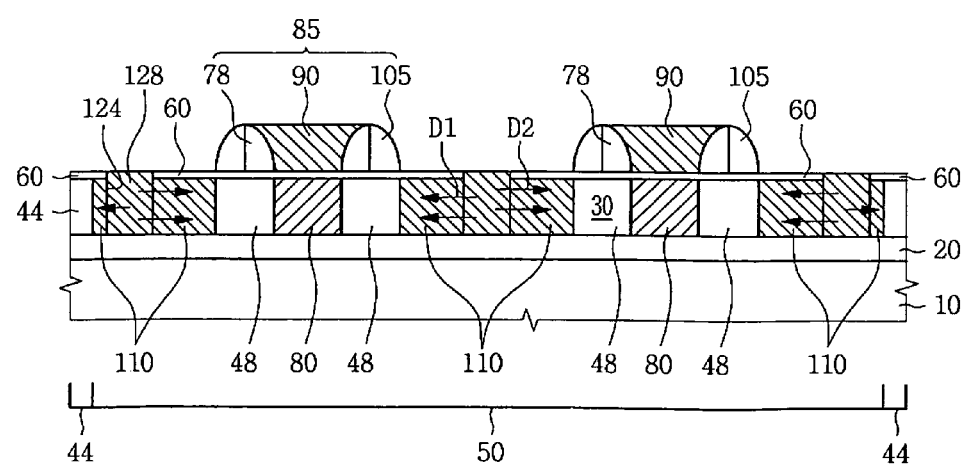

The method shown in FIG. 19 may be performed on the resultant structure shown in FIG. 18 in which second spacers 105 are formed.

Referring to FIG. 19, a photoresist layer (not shown) may be formed on the gate insulating layer 60, the gate patterns 90 and the spacer patterns 85 shown in FIG. 18. The photoresist layer may have openings to expose the gate insulating layer 60 adjacent to the spacer patterns. The openings of the photoresist layer may be formed on both sides of the gate patterns 90. The gate insulating layer 60 and the semiconductor layer 30 may be etched through the openings of the photoresist layer, forming buried holes 124 exposing the insulating layer 20.

After the formation of the buried holes 124, the photoresist layer may be removed. Conductive plugs 128 may be formed to fill the buried holes 124. Impurity ions may be diffused from the conductive plugs 128 into the second semiconductor regions 48 of FIG. 18 in the directions indicated by arrows D1 and D2, forming third semiconductor regions 110. The third semiconductor regions 110 may have a different conductivity type from the first and second semiconductor regions 80 and 48. The conductive plugs 128 may redefine the second semiconductor regions 48 between the first and third semiconductor regions 80 and 110. As such, the second semiconductor regions 48 may be confined under the spacer patterns 85.

Figure 20:
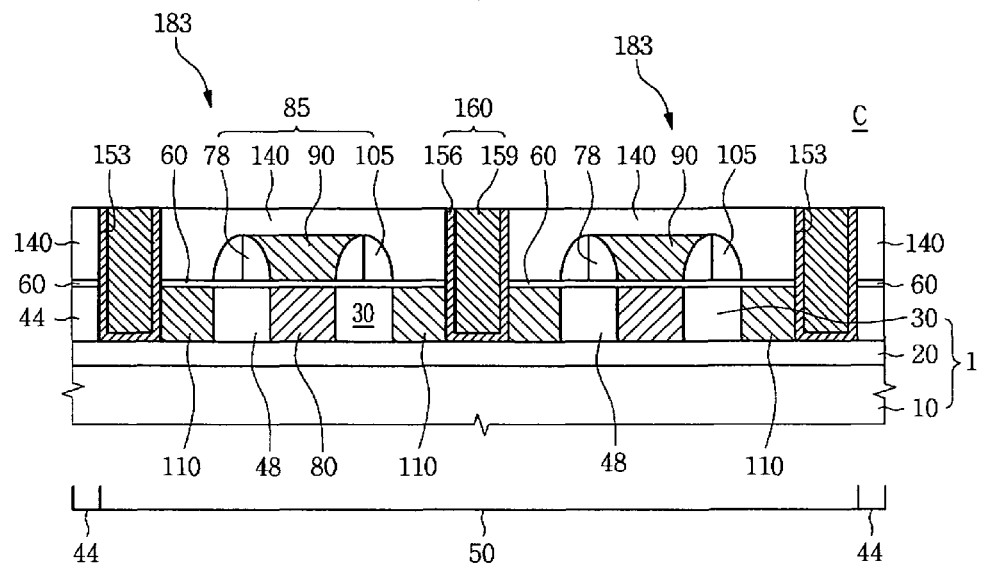

Referring to FIG. 20, a dielectric layer 140 may be formed on the gate insulating layer 60, the gate patterns 90 and the spacer patterns 85. A photoresist layer (not shown) may be formed on the dielectric layer 140. The photoresist layer may have openings having a larger diameter than the widths of the buried holes 124 of FIG. 19. The dielectric layer 140, the gate insulating layer 60 and the semiconductor layer 30 may be etched through the openings of the photoresist layer, forming contact holes 153 exposing the insulating layer 20. The contact holes 153 may expose the device isolation region 44 and the third semiconductor regions 110 of FIG. 18 or 19 disposed adjacent thereto.

According to example embodiment, the contact holes 153 may expose the third semiconductor regions 110 of FIG. 18 or 19 disposed adjacent thereto. The contact holes 153 may be filled with electrode terminals 160, forming transistors 183. Each of the electrode terminals 160 may include a metal nitride layer 156 and a metal layer 159, which are sequentially stacked. Each of the transistors 183 may include the components shown in FIG. 3, together with the third semiconductor regions 110, to form a semiconductor memory cell C.

Figure 21:
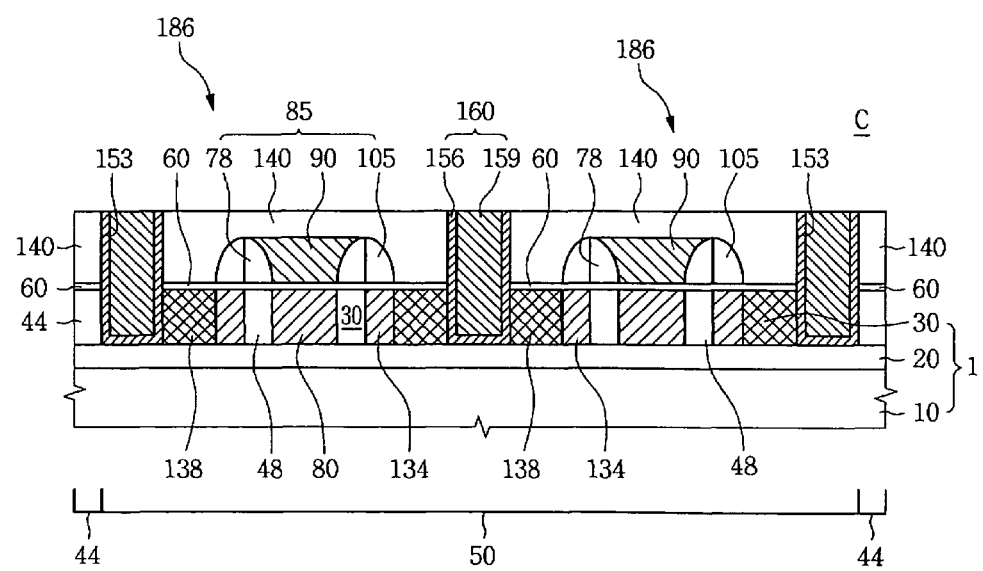
Figure 22:
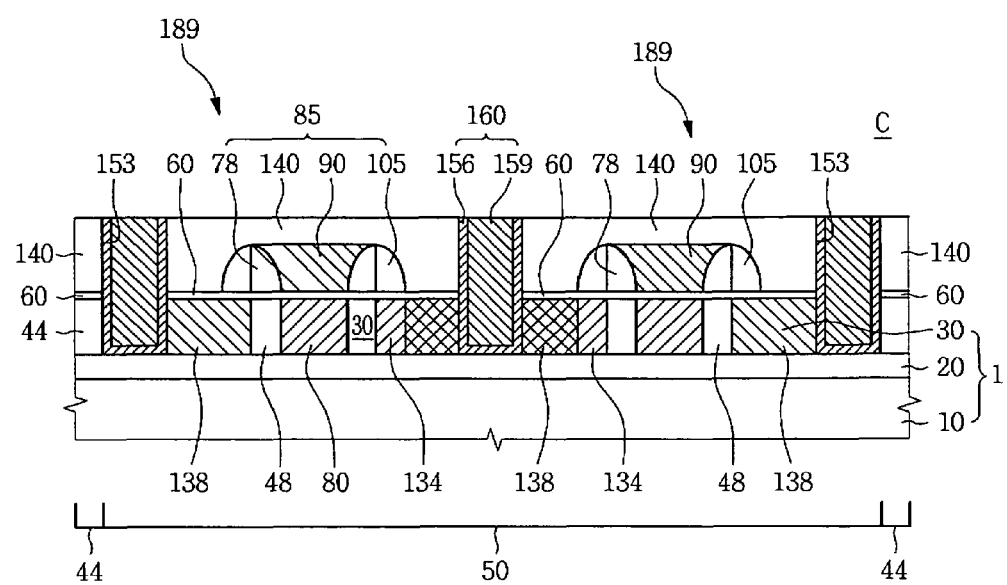

FIGS. 21 and 22 are cross-sectional views, taken along line II-II' of the semiconductor memory cell shown in FIG. 3, illustrating a method of forming a semiconductor memory cell according to example embodiments.

The method shown in FIG. 21 may be performed on the resultant structure shown in FIG. 18 in which first spacers 78 are formed Referring to FIG. 21, an ion implantation process may be performed on a semiconductor layer 30 using gate patterns 90 and the first spacers 78 as a mask. In the ion implantation process, third semiconductor regions 134 may be formed by implanting (or using) impurity ions in second semiconductor regions 48. The second semiconductor regions 48 may be redefined by a first semiconductor region 80 and the third semiconductor regions 134. After the formation of the third semiconductor regions 134, second spacers 105 may be formed on sidewalls of the first spacers 78.

According to example embodiments, the first and second spacers 78 and 105 may constitute spacer patterns 85. The processes described with reference to FIGS. 11 through 13 may be performed on a semiconductor substrate having the gate patterns 90 and the spacer patterns 85. The processes may be performed by selecting photomasks corresponding to photoresist layers, respectively, so as to appropriately form buried holes 124 and contact holes 153 in consideration of the number of the gate patterns 90 disposed on the active region 50.

As such, second semiconductor regions 48 may be formed under the first spacers 78, and third semiconductor regions 134 may be formed under the second spacers 105. Fourth semiconductor regions 138 may be formed adjacent to the second spacers 105. According to example embodiments, transistors 186 may be formed using the above-described components and electrode terminals 160. Each of the transistors 186 may have the same electrical effects as in the transistor 176 shown in FIG. 13. Each of the transistors 186 may include the components shown in FIG. 3, together with the third and fourth semiconductor regions 134 and 138, to form a semiconductor memory cell C.

The method shown in FIG. 22 may be performed on the resultant structure shown in FIG. 18 in which first spacers 78 are formed.

Referring to FIG. 22, an ion implantation process may be performed on a semiconductor layer 30 using gate patterns 90 and the first spacers 78 as masks. The ion implantation process may be performed only on drain regions of transistors 189. In the ion implantation process, third semiconductor regions 134 may be formed by implanting (or using) impurity ions in second semiconductor regions 48 of the drain regions. The second semiconductor regions 48 may be redefined adjacent to the drain regions by a first semiconductor region 80 and the third semiconductor regions 134. The second semiconductor regions 48 may be confined under the first spacers 78 in the vicinity of the drain regions.

According to example embodiments, after the formation of the third semiconductor regions 134, second spacers 105 may be formed on sidewalls of the first spacers 78. The first and second spacers 78 and 105 may constitute spacer patterns 85. The processes described with reference to FIGS. 14 through 16 may be performed on a semiconductor substrate having the gate patterns 90 and the spacer patterns 85. The processes may be performed by selecting photomasks corresponding respectively to photoresist layers so as to appropriately form buried holes 124 and contact holes 153 in consideration of the number of the gate patterns 90 disposed on the active region 50.

As such, in source regions of the transistors 189 according to example embodiments, the second semiconductor regions 48 may be formed under the first spacers 78, while fourth semiconductor regions 138 may be formed adjacent to the first spacers 78. In the drain regions of the transistors 189, the third semiconductor regions 134 may be formed under the second spacers 105, while the fourth semiconductor regions 138 may be formed adjacent to the second spacers 105. According to example embodiments, the transistors 189 may be formed using the above-described components and electrode terminals 160. According to example embodiments, each of the transistors 189 may produce the same electrical effects as the transistor 179 shown in FIG. 16. Each of the transistors 189 may include the components shown in FIG. 3, together with the third and fourth semiconductor regions 134 and 138 to form a semiconductor memory cell C.

According to the above-described example embodiments, the first, second and third semiconductor regions, or the first, second, third and fourth semiconductor regions, may be provided in a semiconductor substrate under gate patterns. The first and second semiconductor regions may have a different conductivity type from the third semiconductor regions and/or the fourth semiconductor regions. The first and second semiconductor regions may be information storage elements of a semiconductor memory cell. The third and fourth semiconductor regions may be source and drain regions of a transistor, or drain and source regions of the transistor.

At least one information storage element may be provided under the gate patterns and spacer patterns disposed on sidewalls of the gate patterns. As such, the information storage element may allow the semiconductor memory cell to have a larger data storage capacity than in the conventional art. The source region or the drain region may not overlap with the gate patterns but disposed adjacent to the gate patterns. Accordingly, a GIDL current may be reduced during the drive of the transistor.

In accordance with the above-described example embodiments, if the first, second and third semiconductor regions are formed according to example embodiments, the second and third semiconductor regions may form graded junctions in the vicinity of the source and drain regions. If the first, second, third and fourth semiconductor regions are formed according to other example embodiments, the second and third semiconductor regions may form graded junctions in the vicinity of the source and drain regions. As such, the graded junctions may reduce the electric field intensity in the vicinity of the drain region and increase the retention time of charges stored in the information storage elements.

In accordance with the above-described example embodiments, the first semiconductor region may have a higher impurity ion concentration than the second semiconductor region. In spite of a reduction in the design rule of the semiconductor memory cell C, the first and second semiconductor regions may increase an effective channel length of the transistor. The electrical properties of the semiconductor memory cell may increase using the transistor having the first, second and third semiconductor regions, or the first, second, third and fourth semiconductor regions, according to example embodiments.

In accordance with the above-described example embodiments, two gate patterns may be disposed on a single active region, and an electrode terminal may be interposed between the gate patterns. The electrode terminal may have a diameter that is greater in size than the channel width of the gate patterns. As such, electrode terminals may electrically isolate the active region in a number equal at least to the number of the gate patterns, preventing inversion of data of the information storage elements corresponding to the gate patterns.

In accordance with the above-described example embodiments, the source and drain regions may not be overlapped with selected gate patterns. The source and drain regions may be formed by diffusing impurity ions from the corresponding conductive plugs disposed on the semiconductor substrate. The conductive plugs may form linear junctions between the information storage elements and the source and drain regions. The linear junctions may facilitate emission of charges from the information storage elements toward the source or drain region per unit time.

While example embodiments have been disclosed herein, it should be understood that other modifications may be possible. Such modifications are not to be regarded as a departure from the spirit and scope of example embodiments of the present application, and all such modifications as would be obvious to one skilled in the art are intended to be within the scope of the following claims.

What is claimed is:

1. A transistor, comprising:
   a gate pattern on a semiconductor substrate;
   at least one spacer pattern on each sidewall of the gate pattern;
   a first semiconductor region under the gate pattern and having a first p-type impurity ion concentration;
   a plurality of second semiconductor regions each under one of the at least one spacer pattern, each of the plurality of second semiconductor regions having a second p-type impurity ion concentration being lower than the first p-type impurity ion concentration;
   a plurality of third semiconductor regions each adjacent to one of the plurality of second semiconductor regions, each of the plurality of third semiconductor regions having a first n-type impurity ion concentration; and
   a fourth semiconductor region under one of the at least one spacer pattern, the fourth semiconductor region having the same impurity ion concentration as each of the plurality of second semiconductor regions, wherein the first, second, third, and fourth semiconductor regions are in the semiconductor substrate and electrically connected to one another;
   a fifth semiconductor region adjacent to another of the at least one spacer pattern, wherein the fourth and fifth semiconductor regions are in the semiconductor layer and electrically connected to the first, second and third semiconductor regions;
   a gate insulating layer between the gate pattern and the semiconductor substrate;
   a dielectric layer on the gate insulating layer to cover the gate pattern and the at least one spacer pattern, wherein the dielectric layer includes an insulating material having silicon nitride that applies tensile stress to the semiconductor layer; and
   a plurality of electrode terminals on both sides of the gate pattern and contacting the insulating layer through the dielectric layer, the gate insulating layer and the semiconductor layer, wherein the plurality of electrode terminals are each in contact with one selected from the group consisting of the third and fifth semiconductor regions.

2. The transistor of claim 1, wherein the semiconductor substrate includes a base plate, an insulating layer and a semiconductor layer, sequentially stacked,
   wherein the base plate and the semiconductor layer each includes silicon,
   the semiconductor layer is in contact with the insulating layer, and
   the first, second and third semiconductor regions are in the semiconductor layer.

3. The transistor of claim 1, wherein a cross-sectional area of the gate pattern increases from a lower surface of the gate pattern towards an upper surface of the gate pattern, and the at least one spacer pattern has a substantially semicircular cross-sectional shape.

4. The transistor of claim 1, wherein a cross-sectional area of the gate pattern increases from a lower surface of the gate pattern toward an upper surface of the gate pattern, and each of the at least one spacer pattern has a substantially semicircular cross-sectional shape.

5. A transistor, comprising:
a gate pattern on a semiconductor substrate, wherein the semiconductor substrate includes a base plate, an insulating layer and a semiconductor layer, sequentially stacked;
at least one spacer pattern on each sidewall of the gate pattern;
a gate insulating layer between the gate pattern and the semiconductor substrate;
a dielectric layer on the gate insulating layer to cover the gate pattern and the at least one spacer pattern, wherein the dielectric layer includes an insulating material having silicon nitride that applies a tensile stress to the semiconductor layer; and
a plurality of electrode terminals on both sides of the gate pattern and contacting the insulating layer through the dielectric layer, the gate insulating layer and the semiconductor layer, wherein the plurality of electrode terminals are in each in contact with one of the plurality of fourth semiconductor regions;
a first semiconductor region under the gate pattern and having a first p-type impurity ion concentration;
a plurality of second semiconductor regions each under one of the at least one spacer pattern, each of the plurality of second semiconductor regions having a second p-type impurity ion concentration being lower than the first p-type impurity ion concentration;
a plurality of third semiconductor regions each adjacent to one of the plurality of second semiconductor regions, each of the plurality of third semiconductor regions having a first n-type impurity ion concentration; and
a plurality of fourth semiconductor regions each adjacent to one of the at least one spacer pattern, wherein each of the plurality of fourth semiconductor regions has a second n-type impurity ion concentration,
wherein the first, second, third and fourth semiconductor regions are electrically connected to one another and in the semiconductor substrate.

6. The transistor of claim 5, wherein the at least one spacer pattern includes a first spacer and a second spacer,
wherein one of the plurality of second semiconductor regions is under the first spacer and overlaps with an upper portion of the gate pattern, and
one of the plurality of third semiconductor regions is adjacent to the second spacer.

7. The transistor of claim 5, wherein the at least one spacer pattern includes a first spacer and a second spacer,
wherein one of the plurality of second semiconductor regions is under the first spacer and overlaps with the upper portion of the gate pattern, and
one of the plurality of fourth semiconductor regions is under the second spacer.

8. The transistor of claim 5, wherein the semiconductor substrate includes a base plate, an insulating layer and a semiconductor layer, sequentially stacked,
wherein the base plate and the semiconductor layer includes silicon,
the first, second, third and fourth semiconductor regions are in the semiconductor layer that is in contact with the insulating layer,
each of the plurality of second semiconductor regions has the same impurity ion concentration as the semiconductor layer, and each the plurality of third semiconductor region has a lower impurity ion concentration than each of the plurality of fourth semiconductor regions.

9. A semiconductor memory cell, comprising:
a semiconductor substrate having an active region and a device isolation region, the device isolation region surrounding the active region, and the semiconductor substrate includes a base plate, an insulating layer and a semiconductor layer sequentially stacked;
at least one gate pattern on the active region;
a plurality of spacer patterns each on a sidewall of the at least one gate pattern;
a gate insulating layer between the at least one gate pattern and the semiconductor substrate;
a dielectric layer on the gate insulating layer to cover the at least one gate pattern and the plurality of spacer patterns, wherein the dielectric layer includes an insulating material having silicon nitride that applies a tensile stress to the semiconductor layer;
a plurality of electrode terminals on both sides of the at least one gate pattern and contacting the insulating layer through the dielectric layer, the gate insulating layer and the semiconductor layer,
a first semiconductor region in the active region under the at least one gate pattern and having a first p-type impurity ion concentration;
a plurality of second semiconductor regions in the active region each under one of the plurality of spacer patterns, wherein each of the second semiconductor regions has a second p-type impurity ion concentration being lower than the first p-type impurity ion concentration; and
a plurality of third semiconductor regions in the active region adjacent to the plurality of spacer patterns, wherein each of the plurality of third semiconductor regions has a first n-type impurity ion concentration,
wherein the first, second and third semiconductor regions are electrically connected to one another, and in the semiconductor substrate, and
wherein the plurality of electrode terminals are each in contact with one selected from the group consisting of the third semiconductor regions.

10. The semiconductor memory cell of claim 9,
wherein the base plate and the semiconductor layer includes silicon,
the first, second and third semiconductor regions are in the semiconductor layer,
the semiconductor layer is in contact with the insulating layer, and
the plurality of second semiconductor regions each have the same impurity ion concentration as the semiconductor layer.

11. The semiconductor memory cell of claim 10, wherein a cross-sectional area of each of the at least one gate pattern increases from a lower surface of the gate pattern towards an upper surface of the gate pattern, and each of the plurality of spacer patterns has a substantially semicircular cross-sectional shape.

12. The semiconductor memory cell of claim 9, further comprising:
a fourth semiconductor region adjacent to one of the plurality of second semiconductor regions,
wherein each of the spacer patterns includes a first spacer and a second spacer,
one of the plurality of second semiconductor regions is under the first spacer,
the fourth semiconductor region is under the second spacer, and the fourth semiconductor region is in the semiconductor layer that is in contact with the insulating layer and is electrically connected to the first, second and third semiconductor regions.

13. The semiconductor memory cell of claim 9, further comprising a plurality of fourth semiconductor regions each adjacent to one of the plurality of second semiconductor regions,
- wherein each of the plurality of spacer patterns includes a first spacer and a second spacer,
- one of the plurality of second semiconductor regions is under the first spacers,
- one of the plurality of fourth semiconductor regions is under the second spacer, and
- the plurality of fourth semiconductor regions are in the semiconductor layer that is in contact with the insulating layer and is electrically connected to the first, second and third semiconductor regions.

14. The semiconductor memory cell of claim 9, wherein each of the plurality of third semiconductor regions are adjacent to one of the plurality of spacer patterns.

15. The semiconductor memory cell of claim 9, further comprising:
- a plurality of fourth semiconductor regions each adjacent to one of the plurality of spacer patterns,
- wherein each of the plurality of fourth semiconductor regions has a second n-type impurity ion concentration, and
- the first, second, third and fourth semiconductor regions are electrically connected to one another and in the semiconductor substrate.

* * * * *